(12) United States Patent
Baik et al.

(10) Patent No.: US 7,553,682 B2
(45) Date of Patent: Jun. 30, 2009

(54) METHOD OF MANUFACTURING VERTICAL NITRIDE LIGHT EMITTING DEVICE

(75) Inventors: Doo Go Baik, Kyungki-do (KR); Bang Won Oh, Kyungki-do (KR); Nam Seung Kim, Kyungki-do (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 270 days.

(21) Appl. No.: 11/584,591

(22) Filed: Oct. 23, 2006

(65) Prior Publication Data
US 2007/0134826 A1    Jun. 14, 2007

(30) Foreign Application Priority Data
Dec. 9, 2005    (KR) ...................... 10-2005-0120435

(51) Int. Cl.
*H01L 21/00* (2006.01)
(52) U.S. Cl. ...................................................... 438/22
(58) Field of Classification Search ................... None
See application file for complete search history.

(56) References Cited

U.S. PATENT DOCUMENTS 7,084,045 B2 * 8/2006 Takayama et al. ........... 438/455
2003/0032210 A1 * 2/2003 Takayama et al. ............. 438/30
2005/0173725 A1 * 8/2005 Kunisato et al. ............ 257/103

* cited by examiner

*Primary Examiner*—Charles D. Garber
*Assistant Examiner*—Andre' C Stevenson
(74) *Attorney, Agent, or Firm*—McDermott Will & Emery LLP

(57) ABSTRACT

According to a method of manufacturing a vertical nitride light emitting device, a first conductivity type nitride layer, an active layer and a second conductivity type nitride layer are sequentially grown on a preliminary growth substrate to form a light emission structure. The light emission structure is cut according to a final size of light emitting devices, leaving a predetermined thickness of the first conductivity type nitride layer intact. A permanent conductive substrate is provided on the light emission structure and the preliminary substrate is diced into a plurality of units. Laser beam is irradiated to detach the preliminary substrate, thereby separating the light emission structure according to the size of the light emitting devices. First and second contacts are formed on the first conductivity type nitride layer and the permanent conductive substrate, respectively. The permanent conductive substrate is diced to complete individual light emitting devices.

9 Claims, 2 Drawing Sheets

Laser beam irradiation

METHOD OF MANUFACTURING VERTICAL NITRIDE LIGHT EMITTING DEVICE

CLAIM OF PRIORITY

This application claims the benefit of Korean Patent Application No. 2005-120435 filed on Dec. 9, 2005, in the Korean Intellectual Property Office, the disclosure of which is incorporated herein by reference.

BACKGROUND OF THE INVENTION

1. Field of the Invention

The present invention relates to a method of manufacturing a vertical nitride light emitting device, and more particularly, to a method of manufacturing a vertical nitride light emitting device which can reduce damage to crystals due to thermal impact during a laser lift-off process, thereby improving a yield.

2. Description of the Related Art

In general, single crystals constituting a group III nitride light emitting device are formed on particular types of growth substrates such as sapphire substrates and silicon carbide SiC substrates. However, the sapphire substrate is an insulation substrate, which greatly limits the arrangement of electrodes in a nitride light emitting device. In a conventional nitride light emitting device, since both electrodes are disposed horizontally, the current flows horizontally along a narrow path. Due to such narrow current flow, the light emitting device has increased forward voltage $V_f$, thus having degraded current efficiency and weak electrostatic discharge effects. In addition, the insulation substrates such as the sapphire substrates have relatively low heat conductivity, thus having ineffective heat discharge characteristics.

To overcome such a problem, a nitride light emitting device having a vertical structure is required. However, the nitride light emitting device having a vertical structure entails a process of removing the sapphire substrate in order to form contact layers on upper and lower surfaces thereof.

As shown in FIG. 1, the sapphire substrate 21 is removed via a laser lift-off process after a conductive substrate 31 is attached onto a light emission structure 25 composed of nitride single crystals. However, the sapphire 21 has a thermal expansion coefficient of about $7.5 \times 10^{-6}$/K, whereas GaN single crystals constituting the light emission structure 25 has a thermal expansion coefficient of about $5.9 \times 10^{-6}$/K and a lattice mismatch of about 16%. In addition, even if a GaN/AlN buffer layer is formed, a lattice mismatch of several % remains. Thus, even if the nitride light emission structure 25' is separated into individual units, the heat generated during irradiation of laser beam onto the sapphire substrate 21 is transferred laterally along the sapphire substrate 21, causing thermal stress, thereby damaging the nitride crystals.

In addition, when the sapphire substrate or wafer is removed from the nitride single crystals after irradiating the laser beam, it is highly likely that there may be collisions between the sapphire substrate being detached and a portion of the nitride single crystals, consequently resulting in a low yield.

SUMMARY OF THE INVENTION

The present invention has been made to solve the foregoing problems of the prior art and therefore an object of certain embodiments of the present invention is to provide a method of manufacturing a nitride light emitting device, in which a sapphire substrate and a nitride light emission structure are separated stably from each other to improve the luminance and reliability of the device.

According to an aspect of the invention for realizing the object, there is provided a method of manufacturing a nitride light emitting device including steps of:

(i) sequentially growing a first conductivity type nitride layer, an active layer and a second conductivity type nitride layer on a preliminary substrate for growth to form a light emission structure;

(ii) cutting a predetermined area of the light emission structure according to a final size of light emitting devices to be produced in such a way that a predetermined thickness of the first conductivity type nitride layer in the predetermined area remains intact from the cutting;

(iii) providing a permanent conductive substrate having electric conductivity on an upper surface of the light emission structure;

(iv) dicing the preliminary substrate into a plurality of units;

(v) irradiating laser beam on a lower surface of the preliminary substrate to separate the preliminary substrate from the light emission structure, whereby the remaining thickness part of the first conductivity type nitride layer is removed, thereby separating the light emission structure according to the light emitting devices;

(vi) forming first contacts on surfaces of the first conductivity type nitride layer separated after the preliminary substrate is removed and forming a second contact on the permanent conductive substrate; and (vii) dicing the permanent conductive substrate into the light emitting devices.

Preferably, in the step (ii), the remaining thickness of the first conductivity nitride layer is 0.01 to 5 μm.

According to a specific embodiment of the present invention, the step (iii) may comprise forming the permanent conductive substrate on an upper surface of the light emission structure via plating. Alternatively, the permanent conductive substrate may be attached onto an upper surface of the light emission structure. In this case, the permanent conductive substrate may be made of one selected from a group consisting of silicon, germanium, SiC, ZnO and GaAs.

In addition, the step of attaching the permanent conductive substrate onto an upper surface of the light emission structure may comprise attaching a lower surface of the permanent conductive substrate onto the upper surface of the light emission structure using a conductive adhesive layer. In this case, the conductive adhesive layer may be made of one selected from a group consisting of Au—Sn, Sn, In, Au—Ag, Ag—In, Ag—Ge, Ag—Cu and Pb—Sn.

Preferably, the step (iv) may comprise dicing the preliminary substrate along a cut line according to the light emitting devices.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

Preferred embodiments of the present invention will now be described in detail with reference to the accompanying drawings.

FIGS. 2a to 2g are side sectional views illustrating respective processes for explaining a method of manufacturing a vertical nitride light emitting device according to a preferred embodiment of the present invention.

Figure 1:
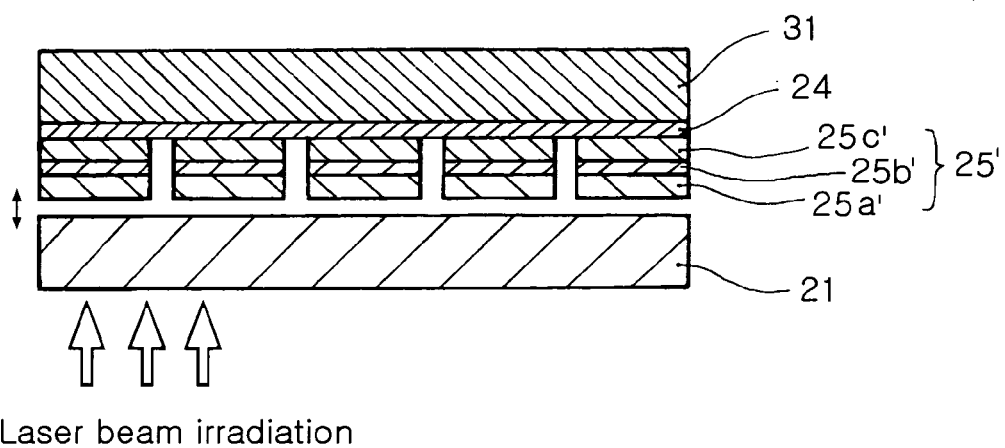
FIG. 1 is a schematic sectional view illustrating a laser lift-off process of a method of manufacturing a vertical nitride light emitting device according to the prior art.
Figure 2:
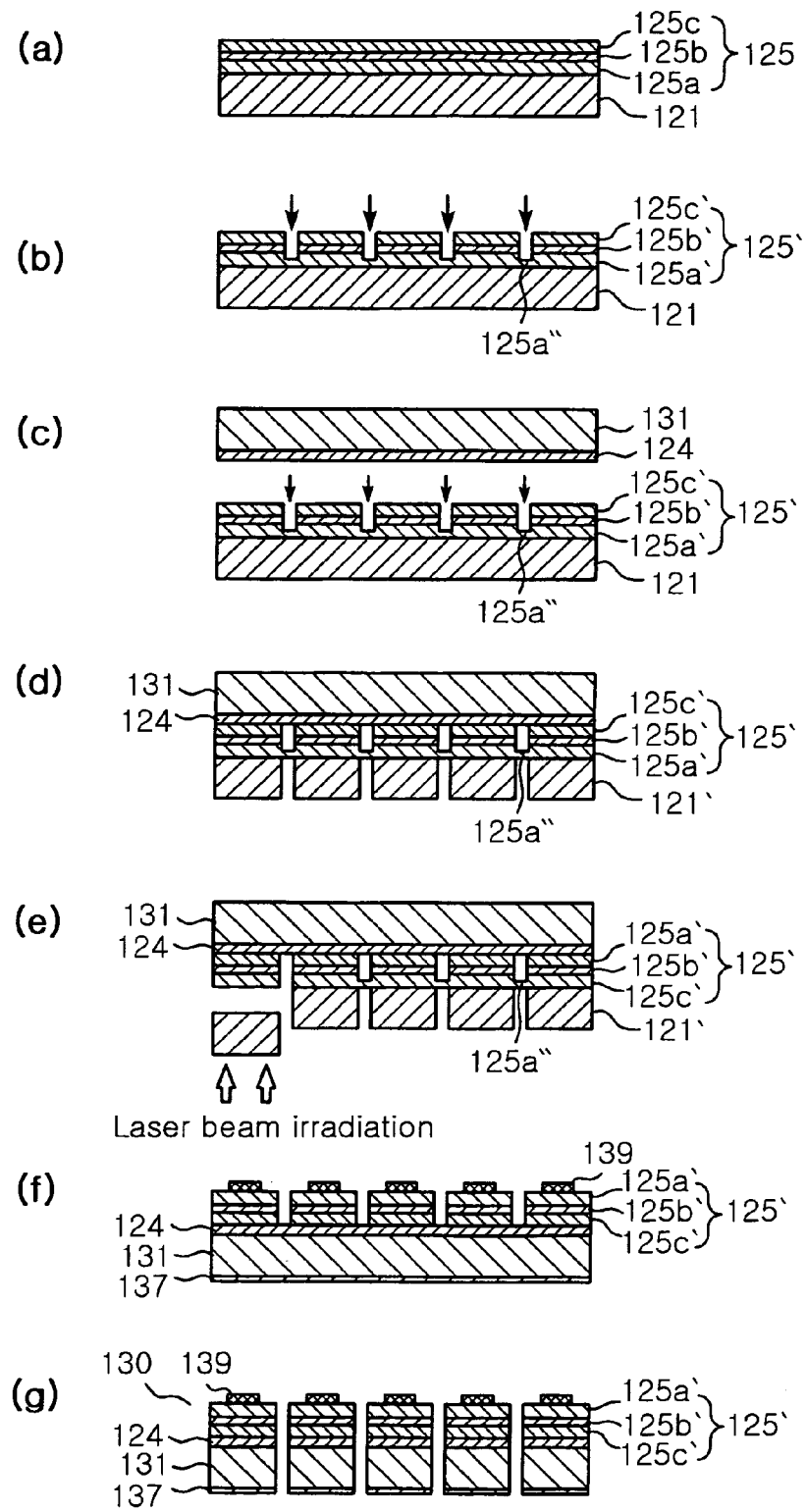
FIGS. 2a to 2g are sectional views illustrating respective processes in a method of manufacturing a vertical nitride light emitting device according to the present invention.

As shown in FIG. 2(a), a light emission structure 125, made of nitride single crystals, is formed on a sapphire substrate 121. The light emission structure 125 includes an n-type nitride layer 125a, an active layer 125b and a p-type nitride layer 125c. Besides the sapphire substrate 121, preliminary substrates according to the present invention may be made of SiC, $MgAl_2O_4$, MgO, $LiAlO_2$ or $LiGaO_2$.

Next, as shown in FIG. 2(b), a predetermined area of the light emission structure 125' is cut according to a size of final devices in such a way that a predetermined thickness portion of the n-type nitride layer 125a remains intact from the cutting. In this cutting process as shown, the light emission structure 125 is not completely separated but some thickness part of the structure remains intact. In this way, the thermal stress generated from laser beam applied during a later step of detaching the sapphire is mitigated. At the same time, the remaining n-type nitride layer portion 125a" of the n-type nitride layer 125a may act as a barrier that prevents a conductive substrate from being damaged by the laser beam irradiated later onto a bottom surface of the sapphire substrate 121 to detach the sapphire substrate 121 from the light emission structure 125 (FIG. 2d). It is preferable that the thickness of the remaining portion 125a" is 30% or less of the total thickness of the light emission structure 125. The thickness of the remaining portion 125a" may vary according to the total thickness of the light emission structure 125, but preferably, it may be about 0.01 to 5 μm, and more preferably, about 0.01 to 1 μm.

Next, as shown in FIG. 2c, a conductive permanent substrate 131 is attached to upper surfaces of the separated portions of the light emission structure 125' using a conductive adhesive layer 124. The conductive permanent substrate may be made of one selected from a group consisting of silicon, germanium, SiC, ZnO, and GaAs. The conductive adhesive layer 124 may be made of one selected from a group consisting of Au—Sn, Sn, In, Au—Ag Ag—In, Ag—Ge, Ag—Cu and Pb—Sn. Such a conductive adhesion layer 124 made of metal/alloy has a relatively high reflection ratio, which is expected to improve luminance. Alternatively, the conductive permanent substrate 131 may be formed of metal such as Ni on an upper surface of the light emission structure 125' via plating.

Next, as shown in FIG. 2d, the sapphire substrate 121 is diced into plurality of units 121'. Such a dicing procedure may be implemented using a blade or via a dry etching process. In the present invention, the sapphire substrate 121 is completely diced into a plurality of unit substrates, decreasing the area of each unit sapphire substrate, which in turn alleviates the thermal stress generated during the irradiation of the laser beam. The present invention is not limited by the dicing sizes and locations of the sapphire substrate portions 121'. However, in order to prevent damage to the nitride layer to be formed into light emitting devices later by the laser irradiation, it is preferable that the sapphire substrate is diced along the areas corresponding to the cutting lines of the light emission structure. If necessary, the sapphire substrate can be diced into unit substrates having the same size as the previously cut units of the light emissions structure 125'.

Next, as shown in FIG. 2e, laser beam is irradiated onto a bottom part of the unit sapphire substrate 121' to detach the sapphire substrate 121' from the light emission structure 125'. The laser beam passes through the sapphire substrate 121' to disintegrate the adjacent n-type nitride layer portion into Ga and $N_2$ in. The laser beam heats at a predetermined temperature to fuse Ga, thereby easily detaching the sapphire substrate 121' from the light emission structure 125'. In this embodiment, the laser lift-off process is implemented individually for each of the diced units of the sapphire substrate 121', thus preventing damage to the nitride thin film in the detachment process and potential decrease in the yield. In addition, the dicing lines of the sapphire substrate 121 are made to correspond to the cutting lines of the light emission structure while a predetermined thickness 125a" of the nitride layer is made to stay intact. Thereby, the conductive adhesive layer 124 or the conductive permanent substrate 131 is prevented from being damaged by the laser beam penetrating through the dicing lines of the sapphire substrate. In the meantime, the remaining thickness portion 125a" of the n-type nitride layer is mechanically removed via for example pulverization, thereby resulting in a self-dicing effect where the partially separated units of the light emission structure 125' are completely separated according to the size of light emitting devices.

Next, as shown in FIG. 2f, contacts are formed on both surfaces of the resultant structure. FIG. 2f illustrates the upside-down resultant structure of FIG. 2e. The contacts are formed on upper surfaces of the n-type nitride layer 125a of the individual light emission structure units 125 and on a lower surface of the conductive permanent substrate 131. Each of the n-contacts 139 is selectively formed on a portion (generally, the center of the upper surface) of an upper surface of each units of the n-type nitride layer 125a, using a mask. The p-contact 137 is formed on an entire lower surface of the conductive substrate 131 as a rear electrode.

Finally, as shown in FIG. 2g, the resultant structure of FIG. 2f is diced according to the size of the light emitting devices, i.e., the size of the separated units of light emission structure 125' to obtain final vertical nitride light emitting devices 130.

According to the present invention as set forth above, a light emission structure is partially separated while a preliminary growth substrate such as a sapphire substrate is completely separated, thereby minimizing thermal stress generated between the light emission structure and the preliminary substrate during a laser lift-off process. In addition, the sapphire substrate is detached from the light emission structure after it is once divided into individual units, thereby effectively reducing the damage due to collision to the thin light emission structure during the process of detaching the sapphire substrate.

While the present invention has been shown and described in connection with the preferred embodiments, it will be apparent to those skilled in the art that modifications and variations can be made without departing from the spirit and scope of the invention as defined by the appended claims.

What is claimed is:

1. A method of manufacturing a nitride light emitting device comprising steps of:
   (i) sequentially growing a first conductivity type nitride layer, an active layer and a second conductivity type nitride layer on a preliminary growth substrate to form a light emission structure;
   (ii) cutting a predetermined area of the light emission structure according to a final size of light emitting devices to be produced in such a way that a predetermined thickness of the first conductivity type nitride layer in the predetermined area remains intact from the cutting;

(iii) providing a permanent conductive substrate having electric conductivity on an upper surface of the light emission structure;

(iv) dicing the preliminary substrate into a plurality of units;

(v) irradiating laser beam on a lower surface of the preliminary substrate to separate the preliminary substrate from the light emission structure, whereby the remaining thickness part of the first conductivity type nitride layer is removed, thereby separating the light emission structure according to the light emitting devices;

(vi) forming first contacts on surfaces of the first conductivity type nitride layer separated after the preliminary substrate is removed and forming a second contact on the permanent conductive substrate; and (vii) dicing the permanent conductive substrate into the light emitting devices.

2. The method according to claim 1, wherein in the step (ii), the remaining thickness of the first conductivity nitride layer is 0.01 to 5 μm.

3. The method according to claim 1, wherein the step (iii) comprises forming the permanent conductive substrate on an upper surface of the light emission structure via plating.

4. The method according to claim 1, wherein the step (iii) comprises attaching the permanent conductive substrate onto an upper surface of the light emission structure.

5. The method according to claim 4, wherein the permanent conductive substrate is made of one selected from a group consisting of silicon, germanium, SiC, ZnO and GaAs.

6. The method according to claim 4, wherein the step of attaching the permanent conductive substrate onto an upper surface of the light emission structure comprises attaching a lower surface of the permanent conductive substrate onto the upper surface of the light emission structure using a conductive adhesive layer.

7. The method according to claim 6, wherein the conductive adhesive layer is made of one selected from a group consisting of Au—Sn, Sn, In, Au—Ag, Ag—In, Ag—Ge, Ag—Cu and Pb—Sn.

8. The method according to claim 1, wherein the step (iv) comprises dicing the preliminary substrate along a cut line according to the light emitting devices.

9. The method according to claim 1, wherein the preliminary substrate is made of one selected from a group consisting of sapphire, SiC, MgAl$_2$O$_4$, MgO, LiAlO$_2$ and LiGaO$_2$.

* * * * *